United States Patent
Hirata et al.

[11] Patent Number: 6,095,830
[45] Date of Patent: Aug. 1, 2000

[54] CARD CONNECTOR WITH IMPROVED GROUNDING TERMINAL

[75] Inventors: Hideyuki Hirata, Yokohama; Soichi Watanabe, Yokohama, both of Japan

[73] Assignee: Molex Incorporated, Lisle, Ill.

[21] Appl. No.: 09/169,720

[22] Filed: Oct. 9, 1998

[30] Foreign Application Priority Data

| Oct. 9, 1997 | [JP] | Japan | 9-293316 |
| Apr. 3, 1998 | [JP] | Japan | 10-108638 |

[51] Int. Cl.⁷ .......................... H01R 13/648; H01R 4/66
[52] U.S. Cl. ................................ 439/101; 439/607
[58] Field of Search .................................. 439/101, 108, 439/607, 92, 95

[56] References Cited

U.S. PATENT DOCUMENTS

| 5,169,324 | 12/1992 | Lemke et al. | 439/101 |
| 5,176,523 | 1/1993 | Lai | 439/64 |
| 5,286,207 | 2/1994 | McHugh | 439/64 |
| 5,288,247 | 2/1994 | Kaufman | 439/101 |
| 5,316,488 | 5/1994 | Gardner et al. | 439/79 |
| 5,318,452 | 6/1994 | Brennian, Jr. et al. | 439/79 |
| 5,470,259 | 11/1995 | Kaufman et al. | 439/607 |
| 5,492,481 | 2/1996 | Lewis | 439/159 |
| 5,564,933 | 10/1996 | Bouchan et al. | 439/101 |
| 5,636,999 | 6/1997 | Hirai et al. | 439/79 |
| 5,688,130 | 11/1997 | Huang | 439/79 |
| 5,725,385 | 3/1998 | Takano et al. | 439/64 |
| 5,775,923 | 7/1998 | Tomioka | 439/79 |

*Primary Examiner*—Michael L. Gellner
*Assistant Examiner*—Antoine Ngandjui
*Attorney, Agent, or Firm*—Stacey E. Caldwell

[57] ABSTRACT

Disclosed is an improved card connector comprising a shell assembly and a pin connector assembly. The pin connector assembly includes an insulating housing mounting upper and lower rows of signal terminals and an upper and lower grounding terminal. The signal terminals include connection pins arranged in upper and lower rows and solder tails for connecting to an underlying printed circuit board. The upper grounding terminal includes a downwardly extending rear wall having window apertures formed therein. The upper rows of signal pins pass through the window apertures without contacting the grounding terminal and terminate at the solder tails. The upper and lower grounding terminals are electrically coupled, and a single row of DIP-type solder tails extending from the lower grounding terminals can be soldered to selected conductors on a printed circuit board to couple both of the grounding terminals to a ground circuit of the printed circuit board.

9 Claims, 11 Drawing Sheets

CARD CONNECTOR WITH IMPROVED GROUNDING TERMINAL

FIELD OF THE INVENTION

The present invention relates to a card connector for connecting a printed circuit to a memory device such as a memory card, communication card, hard-disk drive or the like.

BACKGROUND OF THE INVENTION

Card connectors have been used in personal computers, lap-top computers or notebook computers. They typically comprise a shell assembly to accommodate a memory device, and a pin connector assembly adapted to be coupled to corresponding receptacles of the memory device. The shell assembly may include a card-ejection mechanism integral therewith. Examples of such card connectors are shown in Japanese Patent Application Laid-Open Nos. 6-332573 and 7-302645.

In more and more applications, the card connector is required to be equipped with a grounding terminal to ground the memory device itself to the ground circuit of the printed circuit board. The incorporation of the ground terminal not only increases the difficulty of assembling all of the separate components of the card assembly to the printed circuit board, but also has a tendency to increase the amount of space taken up by the card connector on the printed circuit board. However, there is also an increasing demand for reducing the size of the card connector to reduce the area occupied on the printed circuit board. Also, there is an increasing demand for facilitating the attachment of such a card connector to a printed circuit board to improve the efficiency with which computer parts can be assembled.

SUMMARY OF THE INVENTION

An object of the present invention is therefore to provide an improved card connector equipped with a ground terminal which occupies the smallest possible space on a printed circuit board and facilitates the assembly and attachment of the card connector to the printed circuit board.

To obtain this objective, a card connector for connecting a memory device to an underlying printed circuit board is designed such that the solder tails of the signal terminals and the grounding terminals are arranged in the pin connector assembly so that all of the solder tails can be soldered simultaneously to corresponding conductors in an underlying printed circuit board.

An improved card connector according to the present invention therefore comprises: a shell assembly comprising two shells to accommodate and cover at least a portion of a memory device; and a pin connector assembly comprising an insulating housing having a plurality of signal terminals mounted therein, each signal terminal having a connection pin formed at one end adapted to electrically connect to the memory device, and a solder tail at the other end adapted to be fixed to the surface of the printed circuit board. The connection pins are arranged in upper and lower rows, thereby permitting the connection pins to be received in corresponding upper and lower memory devices inserted in each shell of the shell assembly. Each of the signal terminals in the upper rows of the pin connector assembly includes an SMT-type solder tail formed at its end opposite the connection pin wherein the SMT-type solder tails are arranged in a single, coplanar linear array proximate the rear of the insulating housing. Similarly, each of the signal terminals of the lower rows of the pin connector assembly also includes an SMT-type solder tail formed at the end opposite the connection pin wherein all the SMT-type solder tails are arranged in a single, coplanar linear array proximate the front of the insulating housing.

The insulating housing further includes an upper and lower grounding terminal adapted to engage the conductive casing of the memory device and electrically connect the casing to a ground circuit of the printed circuit board. The upper grounding terminal is positioned above the connection pins of the upper rows of signal terminals and the lower grounding terminal is positioned above the connection pins of the lower rows of signal terminals. This arrangement permits the grounding terminals to be parallel with the connection pins, assuring that the grounding terminals make good electrical contact with the conductive casing of a memory card device upon insertion into the shell assembly.

The upper grounding terminal includes a downwardly extending rear wall having window apertures formed therein. The signal terminals in the upper rows pass through the window apertures without contacting the upper grounding terminal.

The upper and lower grounding terminals are electrically coupled by way of coupling contacts on the upper grounding terminal. The lower grounding terminal includes a single linear array of through-hole or DIP-type solder tails which, when soldered to the printed circuit board, couple both grounding terminals to the ground circuit of the circuit board. The single row of DIP-type through-hole solder tails of the grounding terminal is positioned along the printed circuit board between the SMT-type solder tails of the upper rows and lower rows of signal terminals. This single linear array of solder tails from the lower grounding terminal extends through the underlying circuit board within the dimensions already occupied by the card connector thereby effectively reducing the space that would otherwise be occupied by the solder tails from an upper grounding terminal. Furthermore, since the solder tails of the lower grounding terminal are arranged in a single row, this also effectively reduces the solder area on the printed circuit board and enhances the grounding effect of the terminals. These DIP-type solder tails can be soldered simultaneously with the solder tails of the signal terminals of the pin connector assembly.

The position of the SMT-type solder tails at the front of the insulating housing may be maintained with the aid of an alignment guide, provided on the bottom of the insulating housing. The alignment guide is removably attached to the insulating housing. For this purpose, the alignment guide is designed to slide along forwardly extending opposite arms of the insulating housing and to be removed after soldering.

The pin connector assembly is combined with the shell assembly by fitting engagement pieces of the shells into engagement slots formed on the front of the insulating housing of the pin connector assembly, and by fitting engagement nails of the shells into guide slots formed on the upper and lower surfaces of opposite arms on the front of the insulating housing of the pin connector assembly.

With this arrangement, the shell assembly and the pin connector assembly are firmly fixed together after the pin connector assembly is soldered to the printed circuit board.

The upper and lower shells are adapted to be placed vertically on each other, together forming the shell assembly. Each shell includes integral engagement pieces and an integral nail at one side behind the engagement pieces. Since the receiving and guiding slots are present on both sides of the insulating housing of the pin connector assembly, the shell assembly can be assembled to the pin connector assembly regardless of the orientation of the shell assembly.

Other objects and advantages of the present invention will be better understood from the following description of a card connector according to a preferred embodiment of the present invention, which is shown in the accompanying drawings.

BRIEF DESCRIPTION OF THE DRAWINGS

The features of this invention which are believed to be novel are set forth with particularity in the appended claims. The invention together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
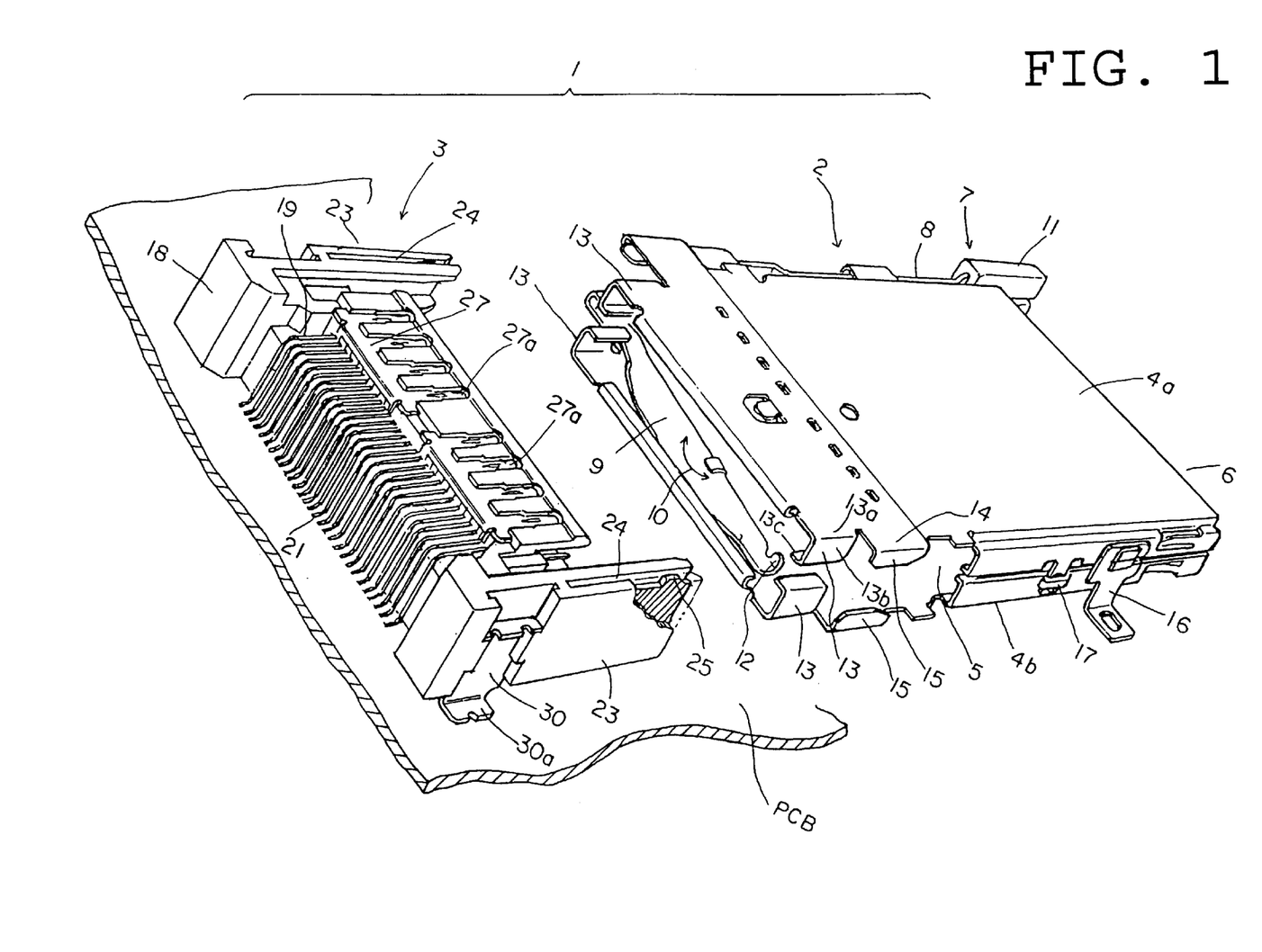
FIG. 1 is a perspective view of the card connector, the pin connector assembly and the shell assembly being separated.

Referring to the figures and first to FIG. 1, a card connector 1 includes a shell assembly 2 adapted to accommodate and cover at least a portion of a memory device (not shown); and a pin connector assembly 3. Pin connector assembly 3 includes an insulating housing 18 mounting a plurality of signal terminals 19 and upper and lower grounding terminals 27. Card connector 1 is adapted to be mounted to an underlying printed circuit board (not shown).

Figure 2:
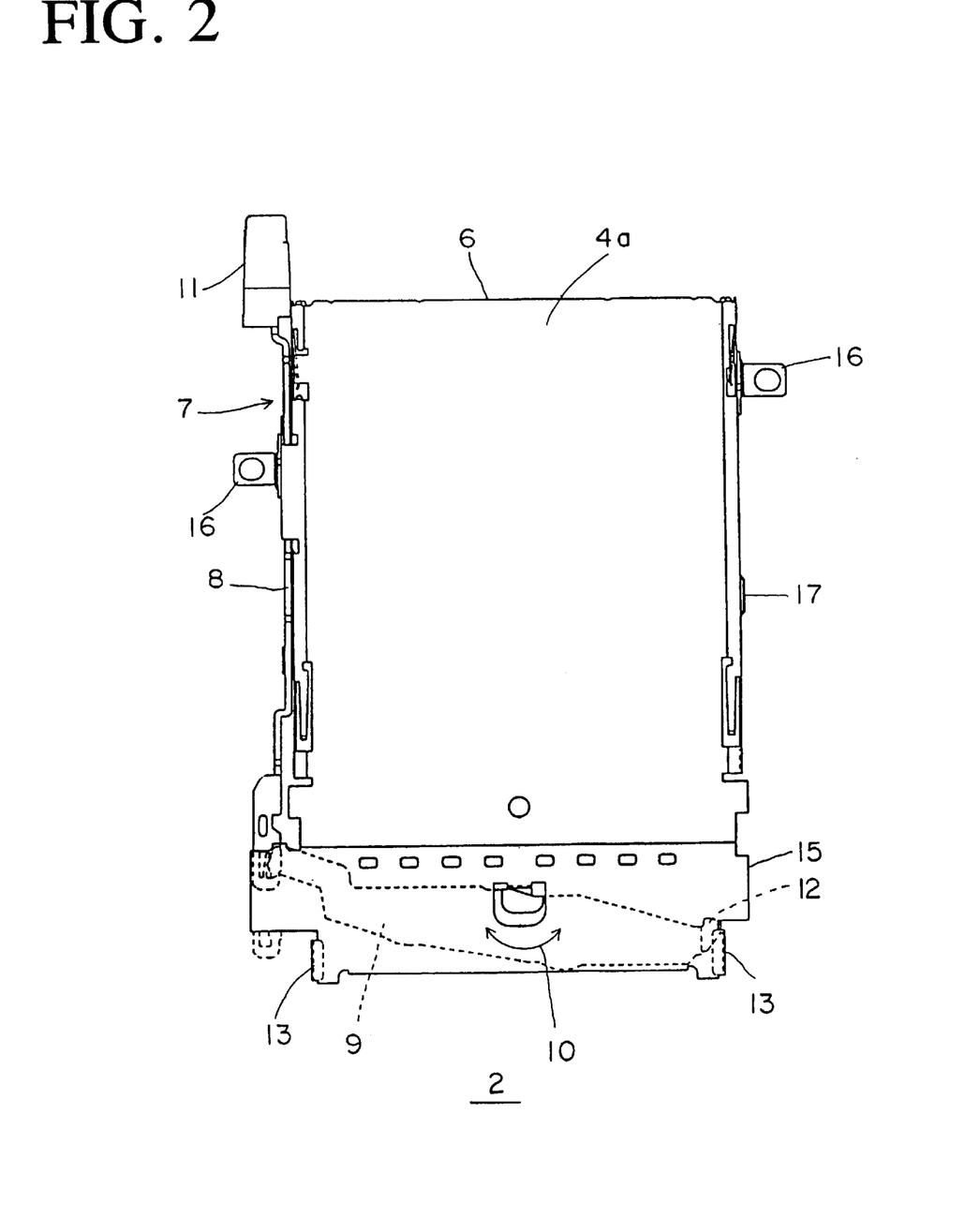
FIG. 2 is a plan view of the card connector.
Figure 3:
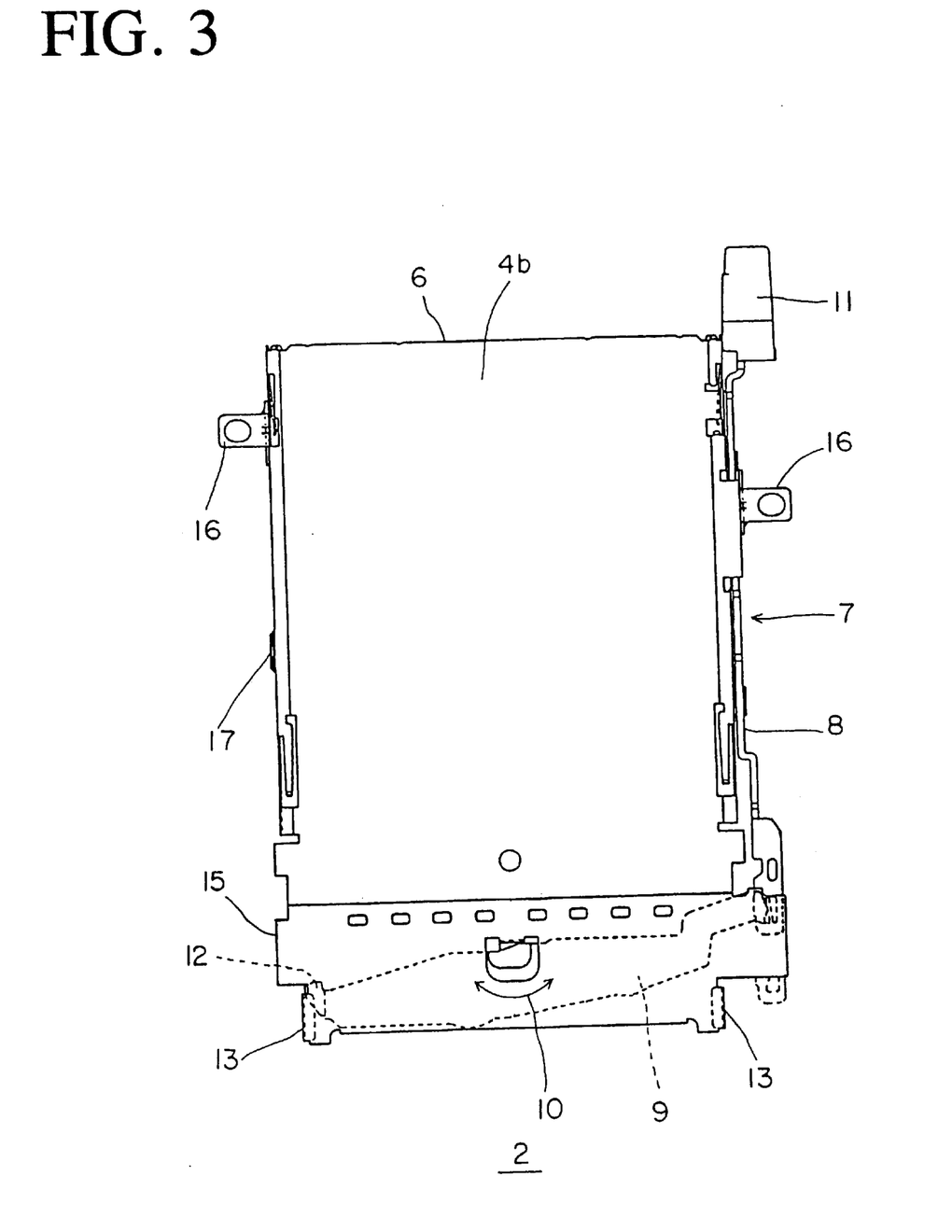
FIG. 3 is a bottom view of the card connector.
Figure 4:
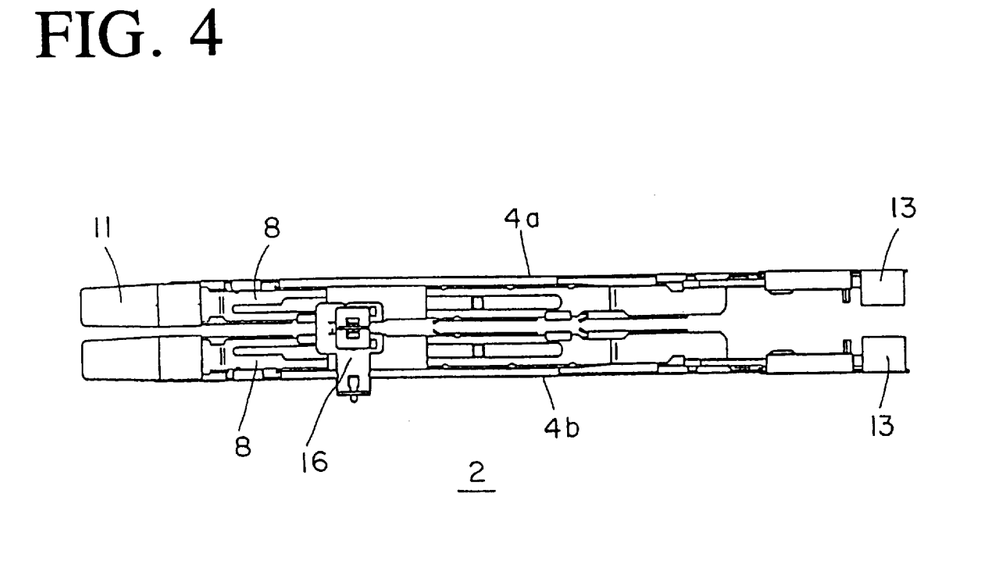
FIG. 4 is a left side view of the card connector.
Figure 5:
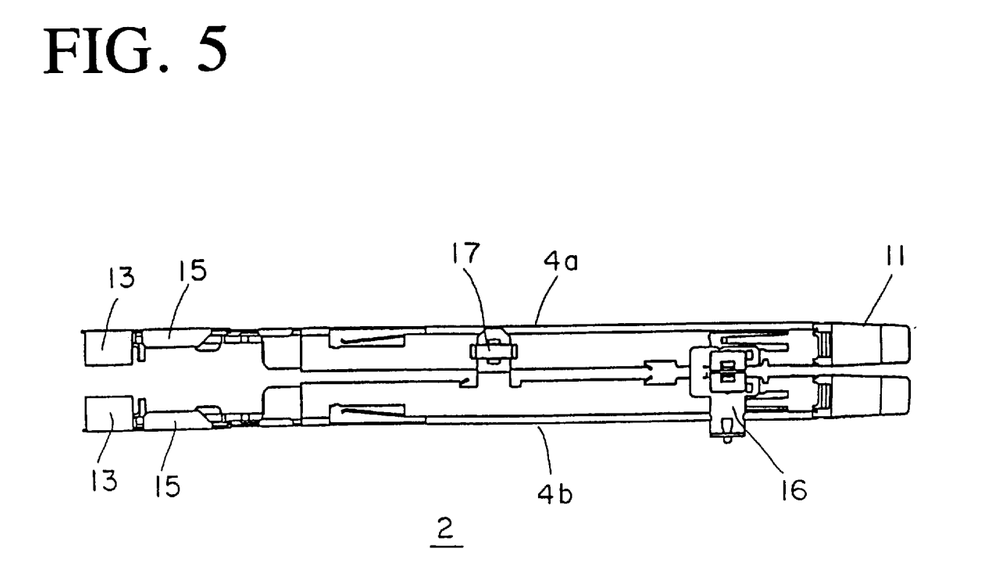
FIG. 5 is a right side view of the card connector.
Figure 6:
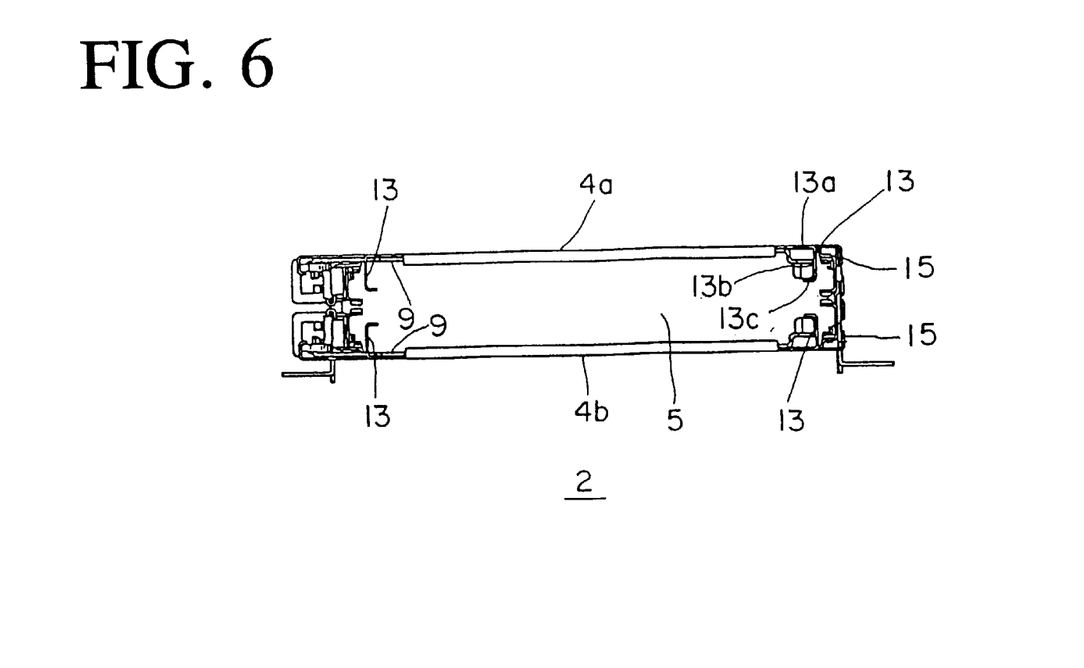
FIG. 6 is a front view of the card connector.
Figure 7:
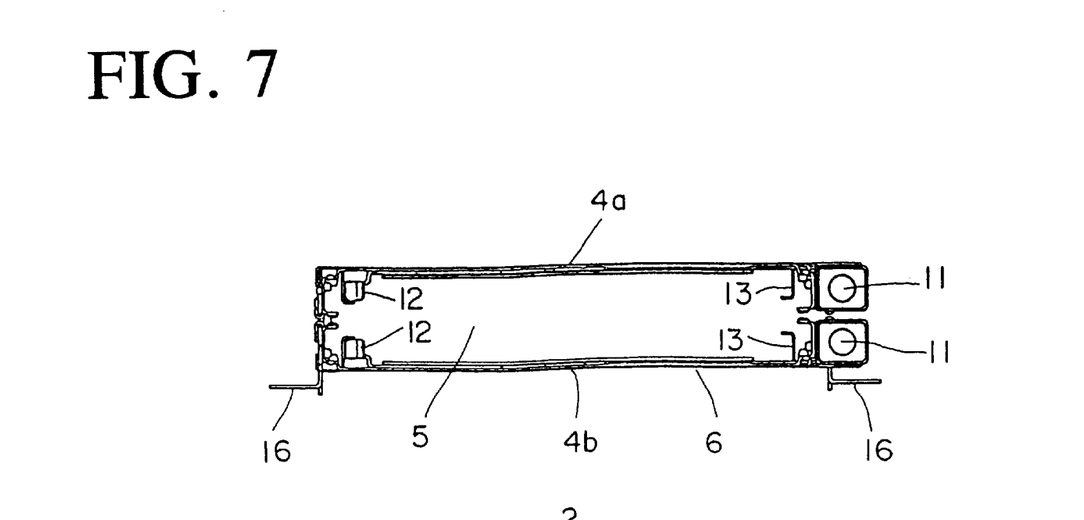
FIG. 7 is a rear view of the card connector.

Referring to FIGS. 2 and 7, shell assembly 2 comprises upper and lower rectangular box-like shells 4a and 4b to be vertically combined to define an inner space 5 which accommodates two memory cards or communication cards (not shown), or a single HDD package or type III memory card (not shown). Inner space 5 is attached to a card slot 6 on the front end of the card connector (the upper end in FIG. 2). Each shell 4a and 4b includes a card-ejection mechanism 7 independently attached thereto. Card-ejection mechanism 7 comprises an eject rod 8 and an eject lever 9. Eject rod 8 is slideably attached along a longitudinal side of each shell 4a and 4b, and eject lever 9 is swingably attached to the rear side of each of upper and lower shells 4a and 4b, as indicated by arrow 10. Eject rod 8 is connected to one end of eject lever 9 and is actuated by pushing an actuating button 11 at the end of eject rod 8, to cause eject lever 9 to swing and thereby eject the memory card out of card slot 6 by way of eject nail 12 of eject lever 9.

Upper shell 4a includes L-shaped engagement pieces 13 formed on opposite sides of a rear end thereof. Each L-shaped engagement piece 13 is composed of two horizontal sections 13a and 13c and a vertical section 13b. L-shaped engagement piece 13 is formed by bending the lateral extension from a rear corner of the shell. Upper shell 4a also includes an engagement nail 15 on one side of the shell assembly immediately forward of L-shaped engagement piece 13. The engagement nail 15 is composed of a horizontal extension 14 extending beyond L-shaped engagement piece 13 and a vertical section 15 extending downwardly from the end of horizontal extension 14. Each engagement nail 15 is formed by bending the lateral extension from a rear corner of the shell. Likewise, lower shell 4b has similar L-shaped engagement pieces 13 and an engagement nail 15 formed symmetrically relative to those of upper shell 4a. Upper and lower shells 4a and 4b are integrally coupled together by leg pieces 16 and fasteners 17.

Figure 8:
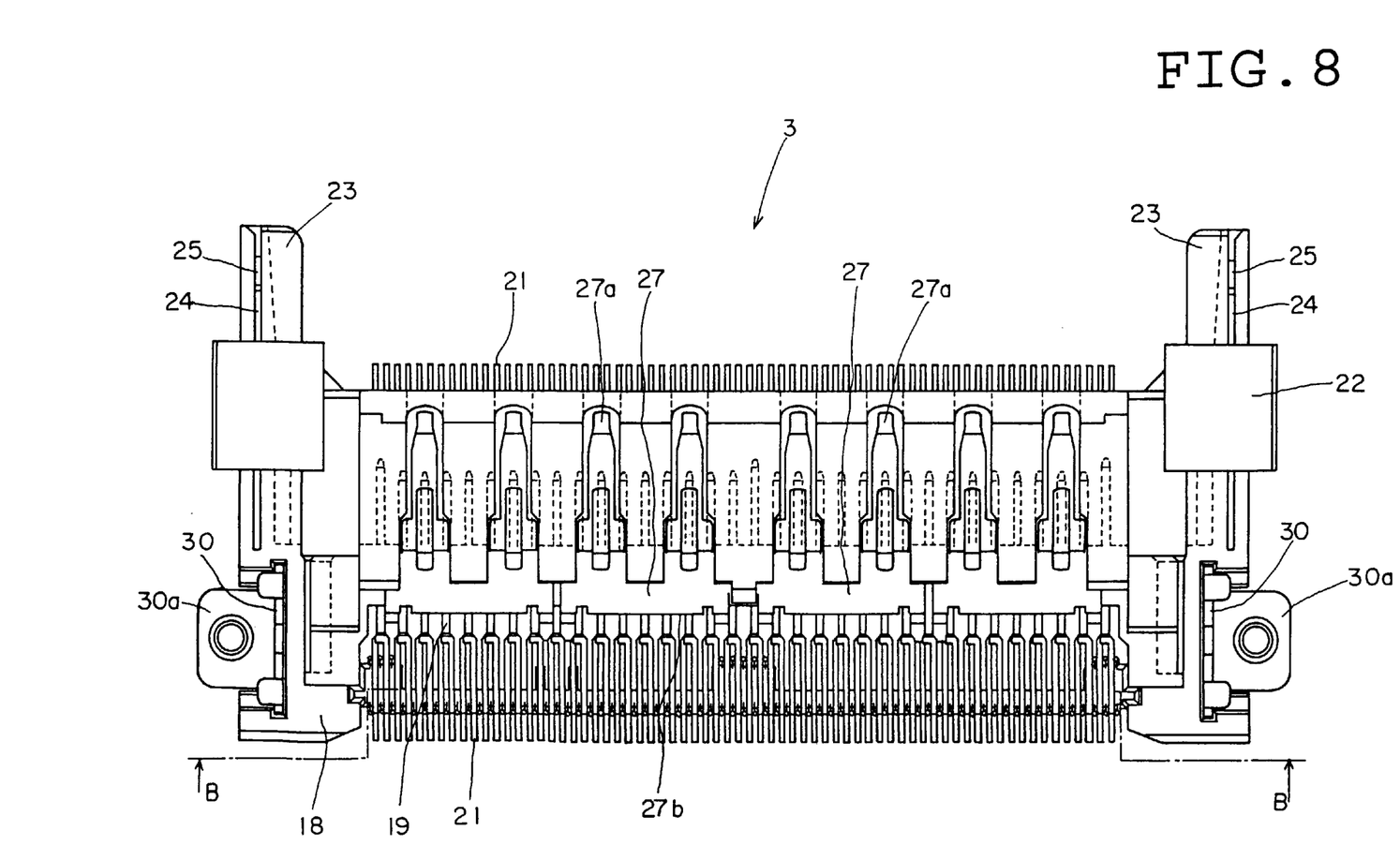
FIG. 8 is an enlarged plan view of the modified pin connector assembly.
Figure 9:
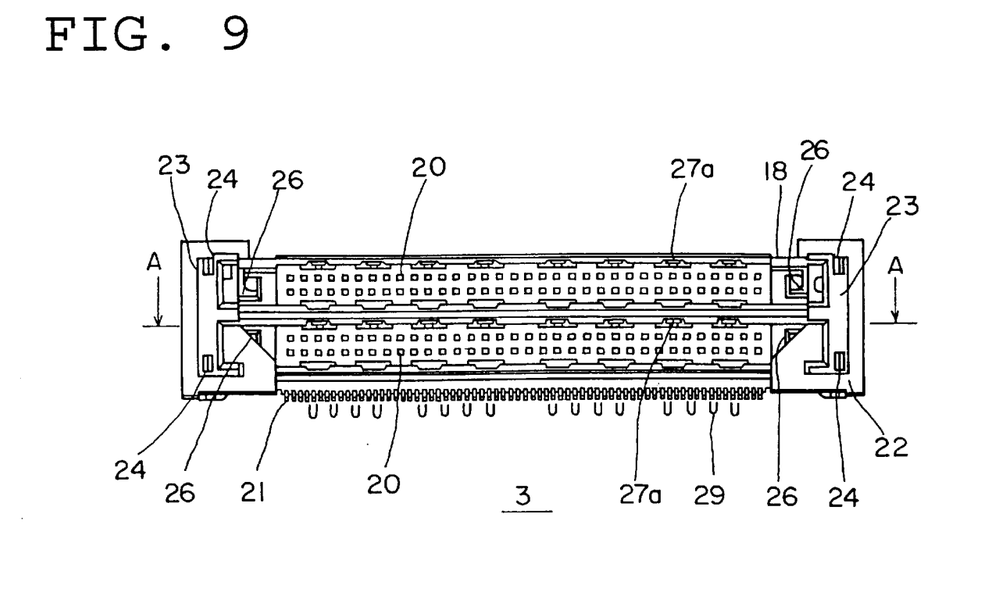
FIG. 9 is a front view of the pin connector assembly.
Figure 10:
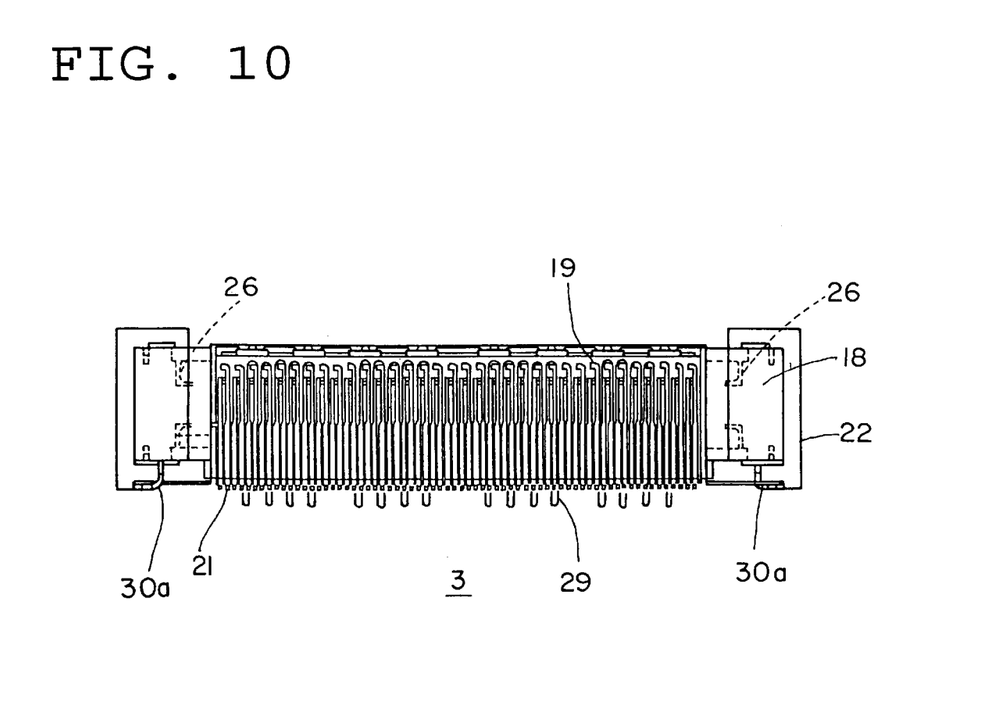
FIG. 10 is a rear view of the pin connector assembly.
Figure 11:
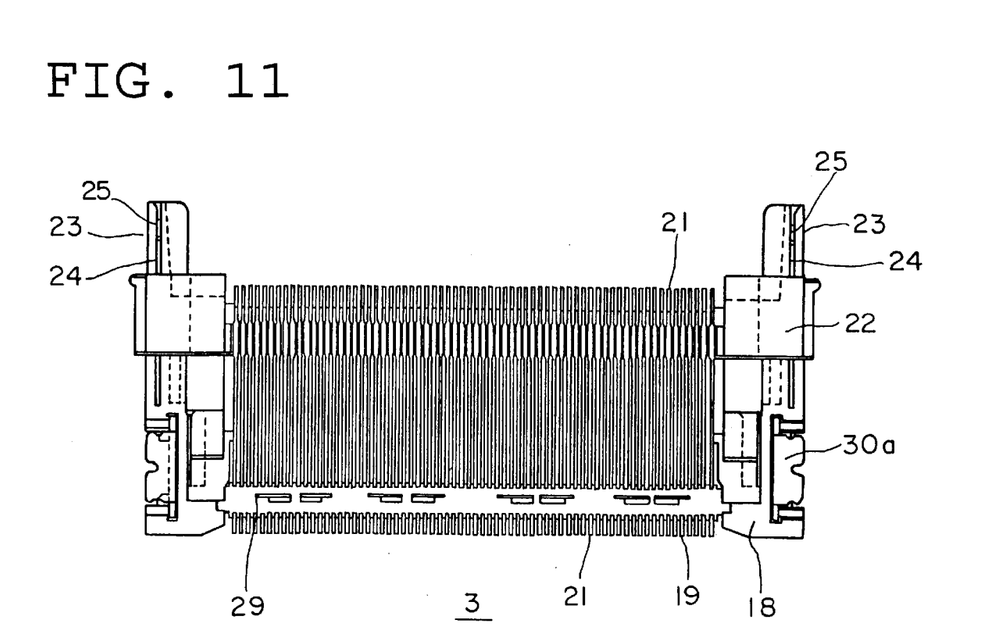
FIG. 11 is a bottom view of the pin connector assembly.
Figure 12:
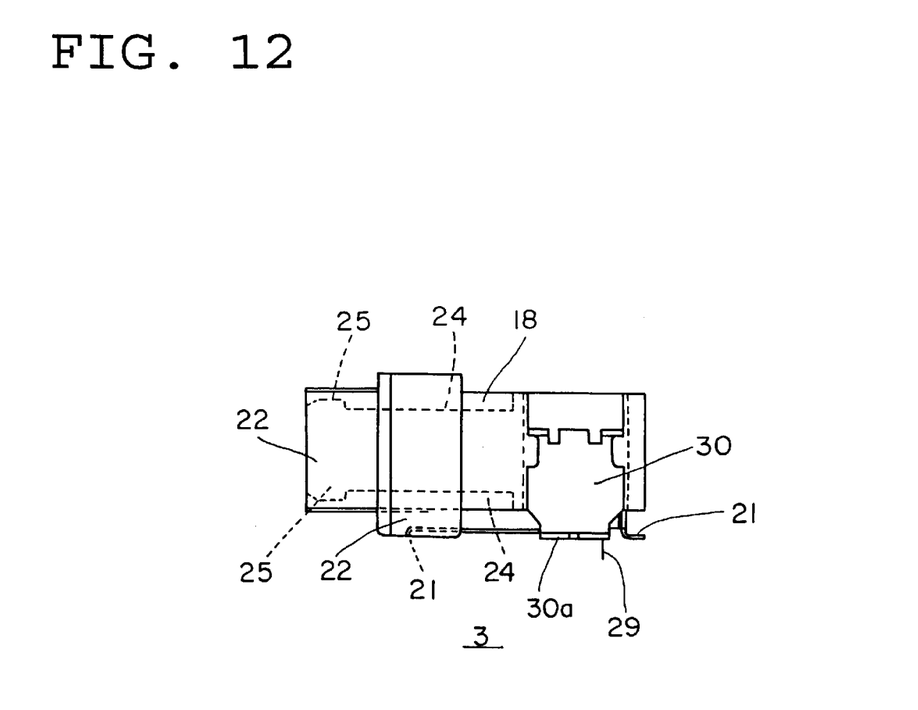
FIG. 12 is a left side view of the pin connector assembly.

Turning now to the pin connector assembly, and specifically referring to FIGS. 8 through 15, pin connector assembly 3 comprises an insulating housing 18 having a plurality of signal terminals 19 and grounding terminals 27 mounted therein. Each signal terminal 19 has a connection pin 20 formed at one end and a solder tail 21 at the opposite end. Connection pins 20 are located at the front of insulating housing 18 (i.e., the upper end in FIG. 8), that is, on the end which pin connector assembly 3 receives the shell assembly 2. As seen in FIG. 9, connection pins 20 are arranged in upper and lower rows to correspond to the upper and lower shells of the shell assembly, thereby permitting connection pins 20 to be received in corresponding receptacles of the memory devices inserted in upper or lower shells 4a and 4b.

The solder tail at one end of each signal terminal 20 is adapted to be soldered to a selected conductor on the printed circuit board. The solder tails 21 of the upper and lower rows of the signal terminals are positioned at the rear and front, respectively, of insulating housing 18. Specifically, signal terminals 19 of the upper rows terminate in solder tails 21 arranged in a single, coplanar linear array at the rear of insulating housing 18 and signal terminals 19 of the lower rows terminate in solder tails 21 arranged in a single, coplanar linear array at the front of insulating housing 18. All solder tails 21 are visible below insulating housing 18 (see FIG. 8), thereby permitting all solder tails 21 to be exposed effectively to the heat radiated from the printed circuit board for reflow-soldering and for visual inspection of solder joints after soldering.

The position of the SMT-type solder tails 21 at the front side of insulating housing 18 is maintained with the aid of a plate-like alignment guide 22 provided on the bottom of insulating housing 18. The alignment guide 22 has comb-like indentations formed on a lower surface for accommodating signal terminals 19 therein, and can be moved back and forth along forwardly extending opposite side arms 23 of insulating housing 18. After soldering solder tails 21 of each of the upper and lower rows of signal terminals 19 to select conductors on the printed circuit board, alignment guide 22 can be moved beyond the ends of opposite side arms 23 and removed altogether from insulating housing 18. Alternatively, alignment guide 22 can be retained as a part of insulating housing 18 after soldering.

Figure 13:
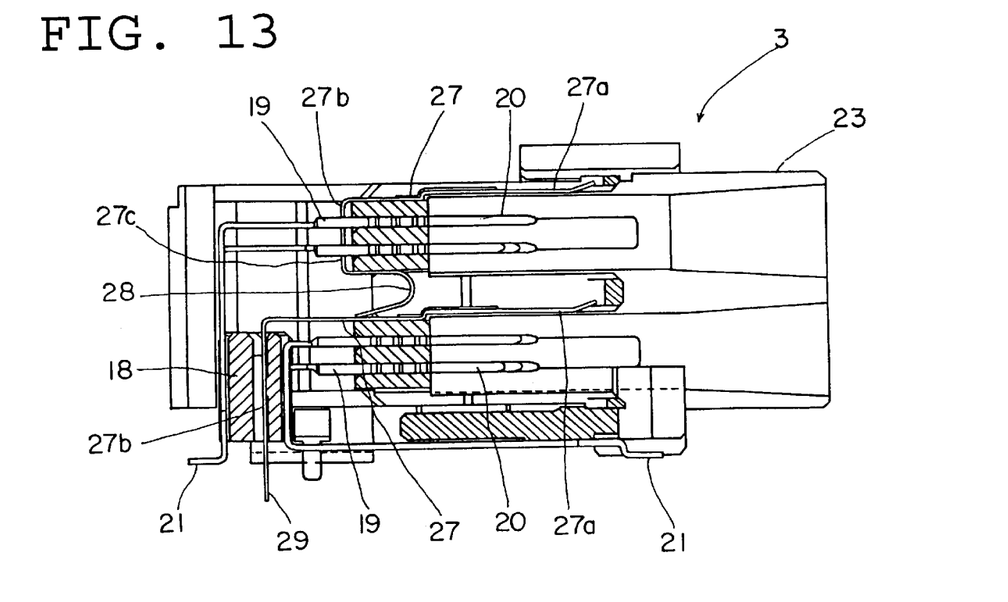
FIG. 13 is an enlarged longitudinal section of the pin connector assembly.
Figure 14:
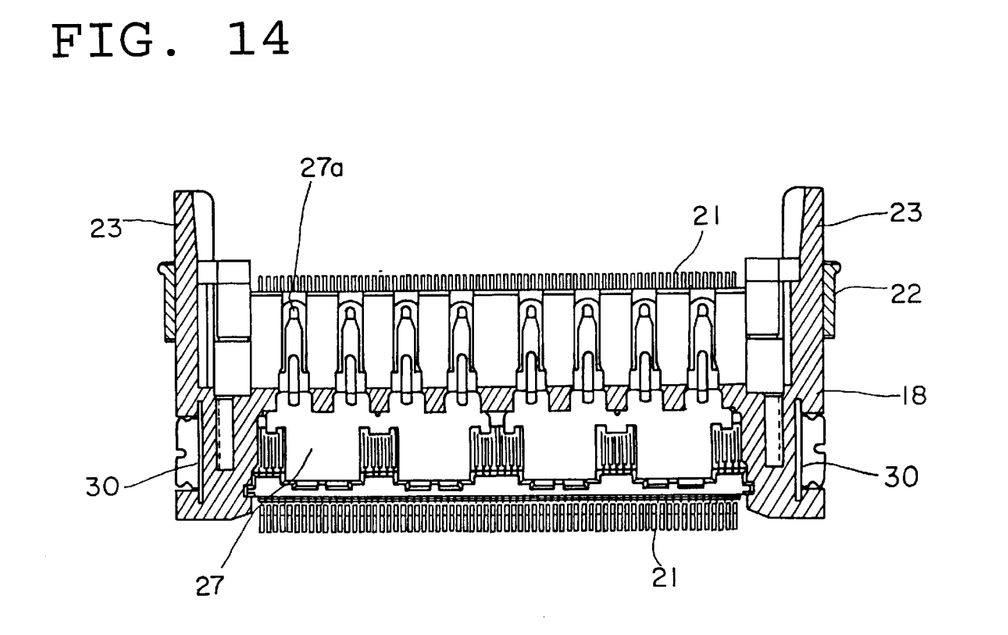
FIG. 14 is an enlarged cross section of the pin connector assembly taken along the line A—A in FIG. 9.
Figure 15:
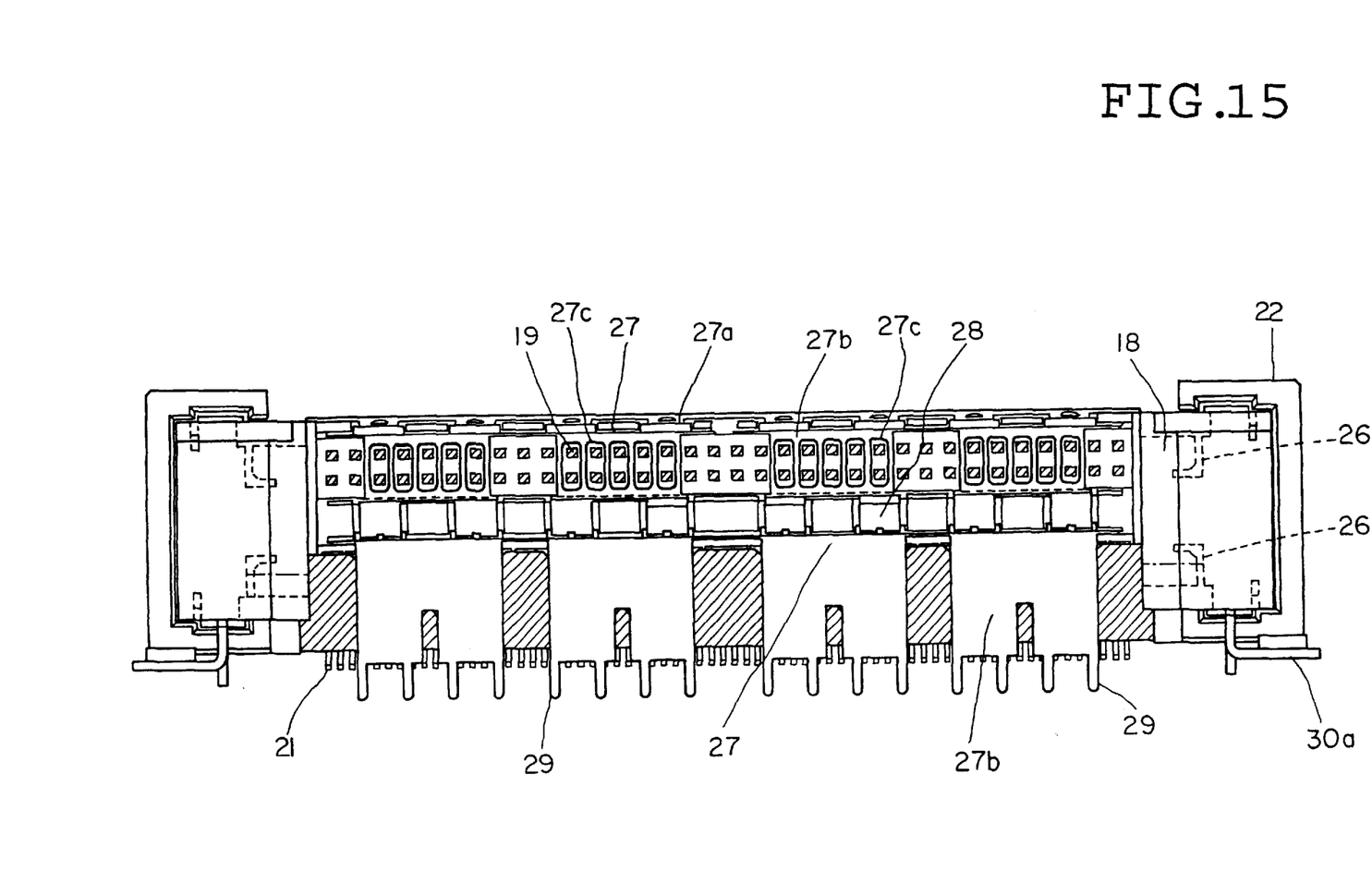
FIG. 15 is an enlarged cross section of the pin connector assembly taken along the line B—B in FIG. 8.

Looking now to FIGS. 13 and 14, upper and lower grounding terminals 27 are arranged proximate each group of connection pins and include ground contacts 27a to make contact with a conductive memory card casing upon insertion into the pin connector assembly. That is, upper grounding terminal 27 is arranged above upper connection pins 20 of signal terminals 19 and lower grounding terminal 27 is arranged above lower connection pins 20 of signal terminals 19. As seen in FIGS. 13 and 15, upper grounding terminal 27 includes "U"-shaped contacts 28 integrally connected to a downwardly extending rear wall section 27b, and the "U"-shaped contacts 28 resiliently contact the lower grounding terminal 27, thereby coupling the upper and lower grounding terminals. Downwardly extending rear wall 27b includes window apertures 27c formed therein. Connection pins 20 of the upper rows of signal terminals 19 pass through the window apertures in rear wall 27b of upper grounding terminal 27 without contacting rear wall 27b (see FIG. 15) or any portion of grounding terminal 27, and terminate at solder tails 21 at the rear of insulating housing 18.

Rear wall sections 27b of lower grounding terminals 27 pass through vertical holes in insulating housing 18, extending downwardly until the DIP-type solder tails 29 of rear wall section 27b of lower grounding terminals 27 are visible at the bottom of insulating housing 18 immediately in front of the solder tails 21 of the upper row of signal terminals 19. With this arrangement, solder tails 29 of the lower ground terminal 27 along with solder tails 21 of both the upper and lower rows of signal terminals 19 can be simultaneously exposed to the heat radiated from the printed circuit board, thereby permitting the simultaneous reflow-soldering of the solder tails 21 and 29. Pin connector housing 3 further includes leg pieces 30 fixed to opposite sides of insulating housing 18 which have solder feet 30a that can be soldered to the printed circuit board at the same time as solder tails 21 and 29.

Insulating housing 18 further includes opposite side arms 23 which facilitate the assembly of shell assembly 2 to pin connector assembly 3. Each side arm 23 has guide slots 24 on upper and lower surfaces thereof for guiding engagement nails 15 of shell assembly 2. Each guide slot 24 includes a detent 25 formed therein to prevent the engagement nails from being easily removed from the guide slot. Each engagement nail 15 overrides the detent 25 to move forward in the guide slot 24. Once engagement nail 15 has overridden detent 25 in guide slot 24, the detent prevents the engagement nail from being pulled out of guide slot 24. Guide slots 24 are formed on the upper and lower surfaces of each side arm 23, whereas upper and lower engagement nails 15 are formed on only one side of shell assembly 2. Thus, only one side arm 23, on the opposite side of eject rod 8 of shell assembly 2, is used in guiding upper and lower engagement nails 15 when the shell assembly is assembled to pin connector assembly 3.

As seen in FIG. 9, insulating housing 18 has four slots 26 formed at its corners for accommodating L-shaped engagement pieces 13 of shell assembly 2 during mating with pin connector assembly 3. These slots 26 are positioned so that L-shaped engagement pieces 13 are received in slots 26 when engagement nails 15 reach the ends of guide slots 24.

The manner in which shell assembly 2 and pin connector assembly 3 are fixed to the printed circuit board is described below.

First, pin connector assembly 3 is fixed to the printed circuit board by simultaneously soldering solder tails 21 of signal terminals 19 and solder tails 29 of grounding terminals 27 to selected conductors on the printed circuit board. Subsequently, shell assembly 2 is mated with pin connector assembly 3.

Specifically, SMT-type solder tails 21 of the lower rows of signal terminals 19 arranged in the single coplanar linear array at the front of insulating housing 18, SMT-type solder tails 21 of the upper rows of signal terminals 19 arranged in the single coplanar linear array at the rear of insulating housing 18, and horizontal feet 30a of leg pieces 30 are soldered to selected conductors such as conductor lands or conductor pads on the printed circuit board according to known surface mounting practices. The required solderings are effected simultaneously in a single step. The DIP-type solder tails 29 of lower grounding terminals 27 arranged in a single linear array are inserted in selected conductive through-holes in the printed circuit board, and can be soldered simultaneously with SMT-type solder tails 21 and horizontal feet 30a by coating the conductive through-holes with reflow-soldering material and by heating the underside of the printed circuit board. The soldered portions of the terminals are visually exposed on the printed circuit board after the soldering process since the shell assembly is not yet assembled thereto, thereby permitting inspection and correction of all of the solder joints.

The location of solder tails 29 of grounding terminals 27 in the area already occupied by insulating housing 18 on the printed circuit board contributes to a significant reduction of the area occupied by the pin connector assembly. Furthermore, the single row of solder tails 29 of grounding terminals 27 permits a significant reduction in the area on the printed circuit board where the conductive through-holes are drilled, compared with the area which would otherwise be occupied. The soldering of solder tails 29 of the grounding terminals 27 to the grounding circuit of the printed circuit board has the effect of enhancing the overall grounding effect in the card connector. Also, the strength with which pin connector assembly 3 is fixed to the printed circuit board is increased by soldering solder tails 29 of grounding terminals 27 to the ground circuit of the printed circuit board.

Figure 16:
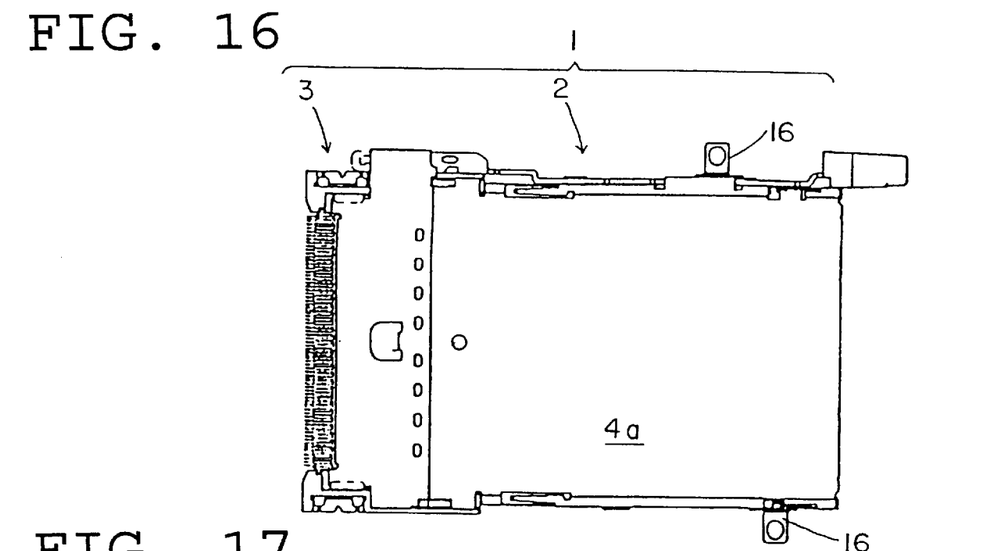
FIG. 16 is a plan view of the pin connector assembly and the shell assembly nested together.
Figure 17:
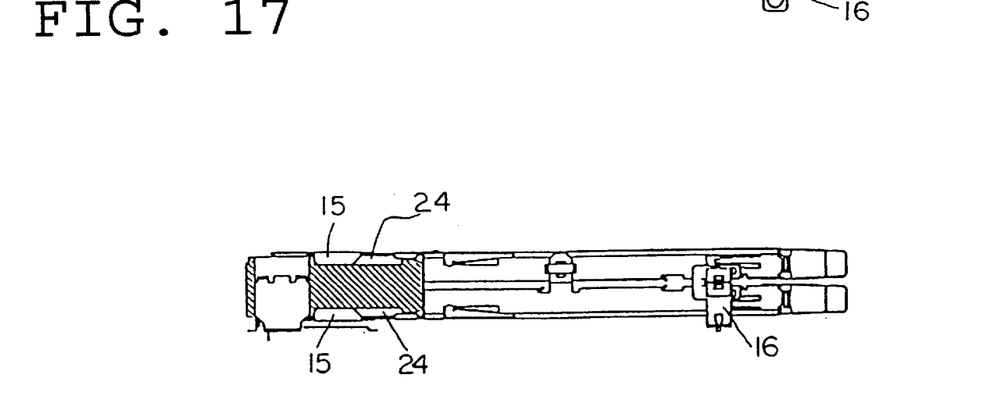
FIG. 17 is a longitudinal section taken along the engagement nail of the pin connector assembly.
Figure 18:
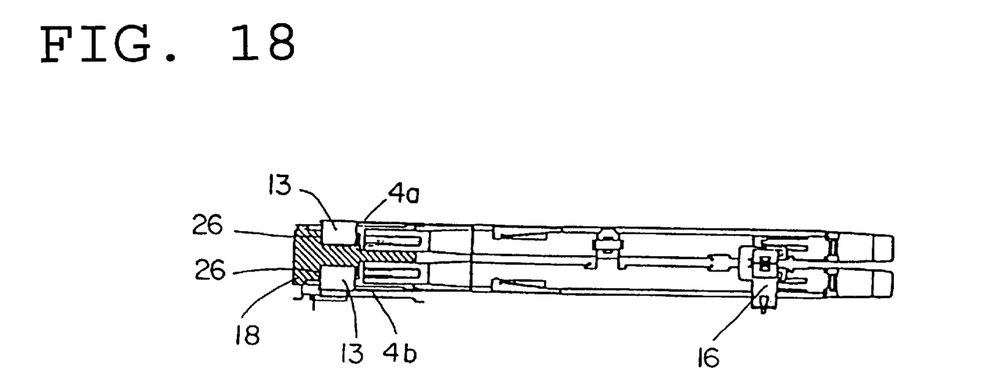
FIG. 18 is another longitudinal section taken along the engagement piece of the pin connector assembly.

To assembly shell assembly 2 to the previously-soldered pin connector assembly, the shell assembly is oriented relative to pin connector assembly 3 with rod 8 on the right side of shell assembly 2, as viewed in the direction in which shell assembly 2 is assembled to pin connector assembly 3. Alternatively, shell assembly 2 can be oriented relative to pin connector assembly 3 with rod 8 on the left side. Shell assembly 2 is assembled to pin connector assembly 3 by inserting and moving engagement nails 15 into guide slots 24 of side arms 23, overriding detents 25 to reach the ends of guide slots 24. Engagement pieces 13 at the rear corners of shell assembly 2 are then received in slots 26 on the front side of insulating housing 17, thereby restraining shell assembly 2 from rattling and other unwanted movement. FIGS. 16 to 18 show shell assembly 2 and pin connector assembly 3 combined to provide a card connector. The card connector can be fixed even more securely to the printed circuit board by fixing leg pieces 16 to the printed circuit board with appropriate fixing means such as screws, thereby preventing the shell assembly from moving relative to pin connector assembly 3.

As may be realized from the above, pin connector assembly 3 is firmly fixed to the printed circuit board by soldering solder tails 21 and 29 of signal and grounding terminals 19 and 27, respectively, and feet 30a of leg pieces 20 to selected conductors and circuits of the printed circuit board. Shell assembly 2 is subsequently firmly fixed to the printed circuit board by leg pieces 16 of shell assembly 2, and via the engagement established between engagement pieces 13 of shell assembly 2 and engagement slots 26 of stationary pin connector assembly 3. Thus, card connector 1 is firmly fixed to the printed circuit board such that card connector 1 is retained in stable condition on the printed circuit board even though a card may be repeatedly inserted and removed from the card connector, thus assuring that the solder joints of solder tails 21 and 29 are free of damages and defect, which could cause deterioration of the electrical performance of the associated electric device. Feet 30a of leg pieces 30 can be fixed to the printed circuit board by screws rather than soldering. Such leg pieces 30 are shown in FIGS. 8 and 15.

It will be understood that the invention may be embodied in other specific forms without departing from the spirit of central characteristics thereof. The present examples and embodiments, therefore, are to be considered in all respects as illustrative and not restrictive, and the invention is not to be limite Patent details given herein.

We claim:

1. A card connector for connecting an upper and lower memory device to a printed circuit board having a ground circuit, comprising:

a shell assembly to accommodate and cover at least a portion of the memory devices; and a pin connector assembly including an insulating housing with a plurality of signal terminals mounted and arranged in upper and lower rows in the housing corresponding to the upper and lower memory devices, each signal terminal having a connection pin formed at one end and a solder tail formed at the other end, and an upper and lower grounding terminal corresponding to the upper and lower memory devices for connection to the ground circuit of the printed circuit board and arranged generally above the upper and lower rows of the connection pins, wherein the upper grounding terminal includes a downwardly extending rear wall including window apertures formed therein, and wherein the signal terminals of the upper rows pass through the window apertures of the rear wall without contacting the rear wall and terminate in solder tails adapted to be soldered to a surface of the printed circuit board.

2. A card connector according to claim 1 wherein one of the grounding terminals includes coupling contacts to couple the upper and lower grounding terminals, and wherein the lower grounding terminal includes a downwardly extending rear wall that terminates in a single linear array of through-hole solder tails adapted to be soldered in corresponding holes in the printed circuit board, whereby both the upper and lower grounding terminals are electrically coupled to a ground circuit of the printed circuit board.

3. A card connector according to claim 2 wherein the solder tails of the signal terminals in the upper rows are SMT-type solder tails arranged in a single coplanar linear array proximate the rear of the insulating housing and the solder tails of the terminals in the lower rows are SMT-type solder tails arranged in a single coplanar linear array proximate the front of the insulating housing, wherein the through-hole solder tails of the lower grounding terminal contact the printed circuit in a single linear array between the SMT-type solder tails of the upper and lower rows of signal terminals.

4. A card connector according to claim 3 wherein the position of the SMT-type solder tails of the lower rows of terminals is maintained at least in part by an alignment guide.

5. A card connector according to claim 4 wherein the alignment guide means is removably attached to the insulating housing.

6. A card connector according to claim 4 wherein the alignment guide is slidable along opposite side arms of the insulating housing.

7. A card connector according to claim 1 wherein the shell assembly further includes engagement pieces and the insulating housing of the pin connector assembly further includes engagement slots formed on front, opposite sides thereof, wherein during assembly of the shell assembly to the pin connector assembly, the engagement pieces are inserted in the engagement slots of the housing.

8. A card connector according to claim 7 wherein the shell assembly further includes an engagement nail integrally connected thereto proximate the engagement piece, wherein the shell assembly may be assembled to the pin connector assembly independent of the orientation of the shell assembly.

9. A card connector for connecting an upper and lower memory device to a printed circuit board having a ground circuit, comprising:

a shell assembly to accommodate and cover at least a portion of the memory devices; and a pin connector assembly including an insulating housing with a plurality of signal terminals mounted and arranged in upper and lower rows in the housing corresponding to the upper and lower memory devices, each signal terminal having a connection pin formed at one end and a solder tail formed at the other end, and an upper and lower grounding terminal corresponding to the upper and lower memory devices for connection to the ground circuit of the printed circuit board and arranged generally above the upper and lower rows of the connection pins, wherein one of the grounding terminals includes a downwardly extending rear wall including window apertures formed therein, and wherein the signal terminals of the corresponding row pass through the window apertures of the rear wall without contacting the rear wall and terminate in solder tails adapted to be soldered to a surface of the printed circuit board.

\* \* \* \* \*